US011481524B2

(12) United States Patent
Gamble, IV et al.

(10) Patent No.: US 11,481,524 B2
(45) Date of Patent: Oct. 25, 2022

(54) CONFORMAL COATING ITERATION

(71) Applicant: Microsoft Technology Licensing, LLC, Redmond, WA (US)

(72) Inventors: John King Gamble, IV, Redmond, WA (US); Daniel Gershon Abel, Amsterdam (NL)

(73) Assignee: Microsoft Technology Licensing, LLC, Redmond, WA (US)

( * ) Notice: Subject to any disclaimer, the term of this patent is extended or adjusted under 35 U.S.C. 154(b) by 175 days.

(21) Appl. No.: 16/913,972

(22) Filed: Jun. 26, 2020

(65) Prior Publication Data

US 2021/0406413 A1 Dec. 30, 2021

(51) Int. Cl.
*G06F 30/10* (2020.01)
*G06N 10/00* (2022.01)
*G05B 19/4099* (2006.01)

(52) U.S. Cl.
CPC ......... *G06F 30/10* (2020.01); *G05B 19/4099* (2013.01); *G06N 10/00* (2019.01); *G05B 2219/49023* (2013.01)

(58) Field of Classification Search
CPC .... G06F 30/10; G06N 10/00; G05B 19/4099; G05B 2219/49023
See application file for complete search history.

(56) References Cited

U.S. PATENT DOCUMENTS 6,256,597 B1 * 7/2001 Wang ..................... B25J 9/1661 703/22
10,496,780 B1 12/2019 Lam et al.
(Continued)

FOREIGN PATENT DOCUMENTS

WO 2013163300 A1 10/2013

OTHER PUBLICATIONS

"Design Rules for Drawing Masks using AutoCAD", Retrieved From: https://www.compugraphics-photomasks.com/wp-content/uploads/2015/03/Autocad_Mask_Rules.pdf, Mar. 1, 2015, 10 Pages.
(Continued)

*Primary Examiner* — Thomas C Lee
*Assistant Examiner* — Ameir Myers
(74) *Attorney, Agent, or Firm* — Alleman Hall Creasman & Tuttle LLP (57) ABSTRACT

A computing device is provided, including a processor. The processor may generate a three-dimensional device model at least by receiving one or more three-dimensional substrate elements and one or more two-dimensional lithography elements. Generating the three-dimensional device model may further include generating a conformal coating on the one or more three-dimensional substrate elements over a plurality of conformal coating iterations that have respective iteration layer thicknesses. Each conformal coating iteration may include, for each two-dimensional lithography element, generating an iteration layer overlaid on the one or more three-dimensional substrate elements and having an iteration layer shape of at least a portion of that two-dimensional lithography element. Each conformal coating iteration may further include adding the iteration layer to the conformal coating. The processor may output the three-dimensional device model including the one or more three-dimensional substrate elements and the conformal coating.

16 Claims, 9 Drawing Sheets

(56) References Cited

U.S. PATENT DOCUMENTS

| | | | | |
|---|---|---|---|---|
| 2012/0177814 A1* | 7/2012 | Iraqi | ................... | H05K 3/3452 |
| | | | | 228/256 |
| 2014/0282324 A1* | 9/2014 | Greiner | .................. | G06F 30/39 |
| | | | | 716/111 |
| 2016/0140267 A1* | 5/2016 | Chen | .................. | G03F 7/70633 |
| | | | | 716/55 |
| 2017/0017738 A1* | 1/2017 | Dirks | .................. | H01L 21/3065 |
| 2017/0344683 A1* | 11/2017 | Kamon | .................. | G06F 30/23 |
| 2019/0041192 A1* | 2/2019 | Bourne | ............. | G01B 11/0683 |
| 2019/0044047 A1 | 2/2019 | Elsherbini et al. | | |
| 2019/0286780 A1* | 9/2019 | Greiner | .................. | G06F 30/39 |
| 2019/0318935 A1* | 10/2019 | Lallement | ......... | H01L 21/31111 |
| 2019/0375072 A1* | 12/2019 | Rifaut | ................ | B24D 18/0027 |
| 2020/0078954 A1* | 3/2020 | Penning | ................... | B05C 9/10 |
| 2021/0303741 A1* | 9/2021 | Burns | .................... | G06F 30/10 |
| 2021/0332474 A1* | 10/2021 | Yuan | .................. | H01J 37/3464 |

OTHER PUBLICATIONS

"International Search Report and Written Opinion Issued in PCT Application No. PCT/US2021/023677", dated Jul. 6, 2021, 30 Pages.

"Layout-Driven 3D Process Simulator", Retrieved from: https://www.silvaco.com/products/tcad/process_simulation/victory_process/victory_process.html, Retrieved Date: Jul. 3, 2020, 4 Pages.

* cited by examiner

CONFORMAL COATING ITERATION

BACKGROUND

In order to simulate the behavior of a device manufactured by lithographic methods, such as a qubit device used in quantum computing, lithography emulation may be performed. In lithography emulation, the manufacturing of the device is modeled. This modeling of the manufacturing of the device may include modeling the formation of layers on the surface of the device.

SUMMARY

According to one aspect of the present disclosure, a computing device is provided, including a processor. The processor may be configured to generate a three-dimensional device model at least by receiving one or more three-dimensional substrate elements and receiving one or more two-dimensional lithography elements. Generating the three-dimensional device model may further include generating a conformal coating on the one or more three-dimensional substrate elements over a plurality of conformal coating iterations that have respective iteration layer thicknesses. Each conformal coating iteration may include, for each two-dimensional lithography element of the one or more two-dimensional lithography elements, generating an iteration layer overlaid on the one or more three-dimensional substrate elements. The iteration layer may have the iteration layer thickness and an iteration layer shape of at least a portion of that two-dimensional lithography element. Each conformal coating iteration may further include adding the respective iteration layer generated for each two-dimensional lithography element to the conformal coating. The processor may be further configured to output, to a computer-aided engineering application program, the three-dimensional device model including the one or more three-dimensional substrate elements and the conformal coating.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

One existing method of modeling device geometries is for a user to manually generate models of the device at a computer-aided design (CAD) application program. In an alternative conventional method of modeling the geometries of devices such a semiconductor device, the chemical processes that would occur when manufacturing the semiconductor device may be simulated. However, when designing some devices such as lithographically manufactured qubit devices, large numbers (e.g., thousands or tens of thousands) of different geometric structures for the device may be generated and modeled. Existing methods of modeling device geometries may be overly time-consuming, requiring large amounts of human and processor time to complete, when modeling such lithographically manufactured qubit devices with large numbers of different geometric structures.

Figure 1:
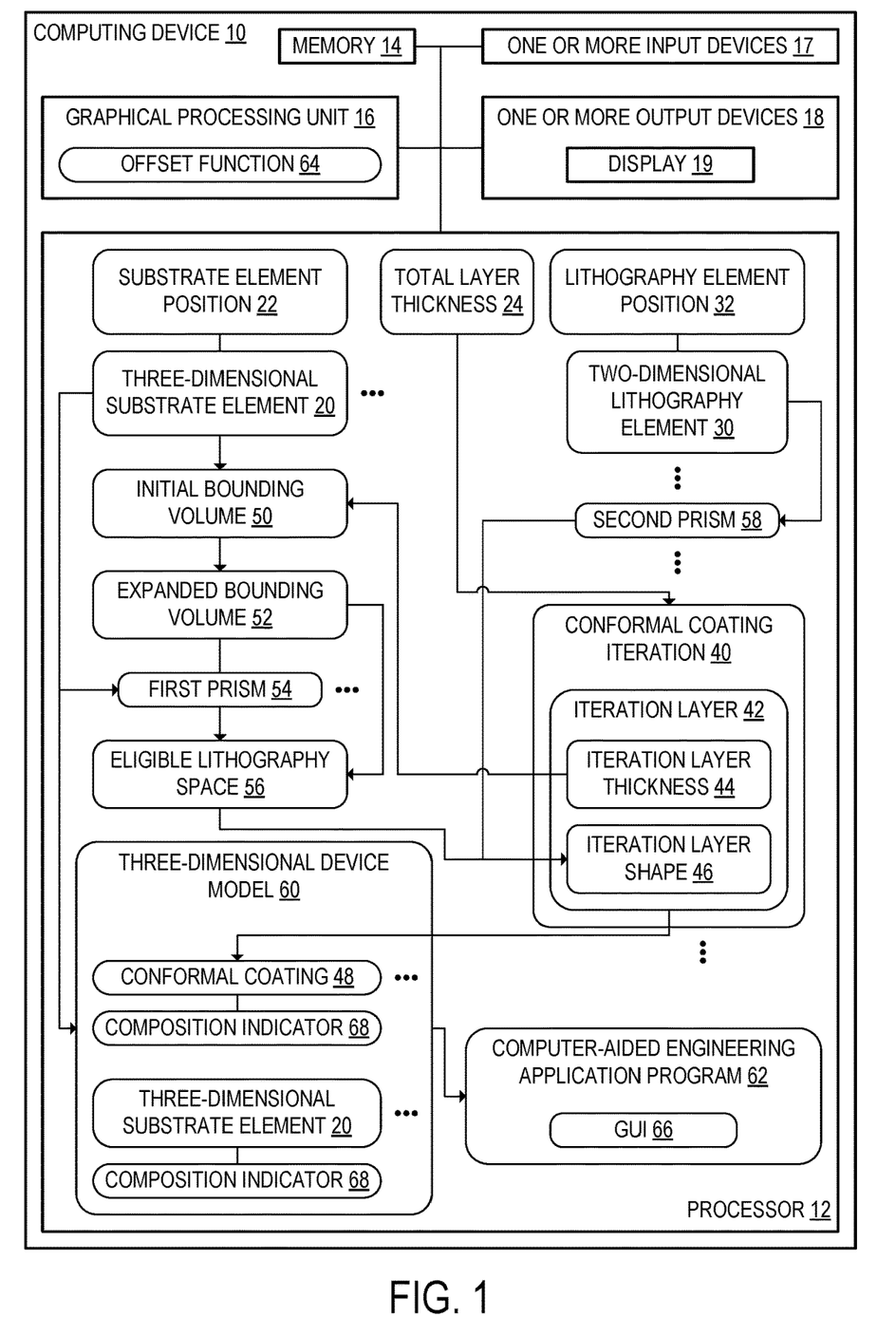
FIG. 1 schematically shows a computing device configured to generate a three-dimensional device model, according to one example embodiment.

In order to address the above issues, a computing device 10 is provided, as schematically shown in FIG. 1. The computing device 10 may include a processor 12 and memory 14, which may be operatively coupled. The processor 12 and the memory 14 may each be instantiated in one or more physical components such as one or more processor cores and/or one or more physical memory modules. The computing device 10 may further include a graphical processing unit (GPU) 16. In some embodiments, the functions of the computing device 10 may be distributed across a plurality of communicatively coupled computing devices. For example, the functions of the computing device 10 may be performed at one or more client computing devices and one or more server computing devices that are configured to communicate with the one or more client computing devices.

The computing device 10 may further include one or more input devices 17. For example, the one or more input devices 17 may include at least one of a keyboard, a mouse, a touchscreen, a trackpad, an accelerometer, a microphone, or some type of input device. In addition, the computing device 10 may further include one or more output devices 18, which may include at least one of a display 19, a speaker, or some other type of output device. In embodiments in which the computing device 10 includes a display 19, the display 19 may be configured to display a graphical user interface (GUI) 66 of a computer-aided engineering application program 62. Via the GUI 66, a user may view output communicated to the display 19 by the processor 12. The GUI 66 may be further configured to receive user input via the one or more user input devices 17.

The processor 12 may be configured to generate a three-dimensional device model 60. For example, the three-dimensional device model may be a virtual representation of a lithographically manufactured qubit device including semiconductor nanowires or some other qubit device or semiconductor device. The three-dimensional device model 60 may include one or more three-dimensional substrate elements 20, which may be three-dimensional virtual representations of components of the modeled device, such as the semiconductor nanowires or insulator layers for example. Each of the one or more three-dimensional substrate elements 20 may be located at a respective substrate element position 22 in the three-dimensional device model 60.

Figure 2:
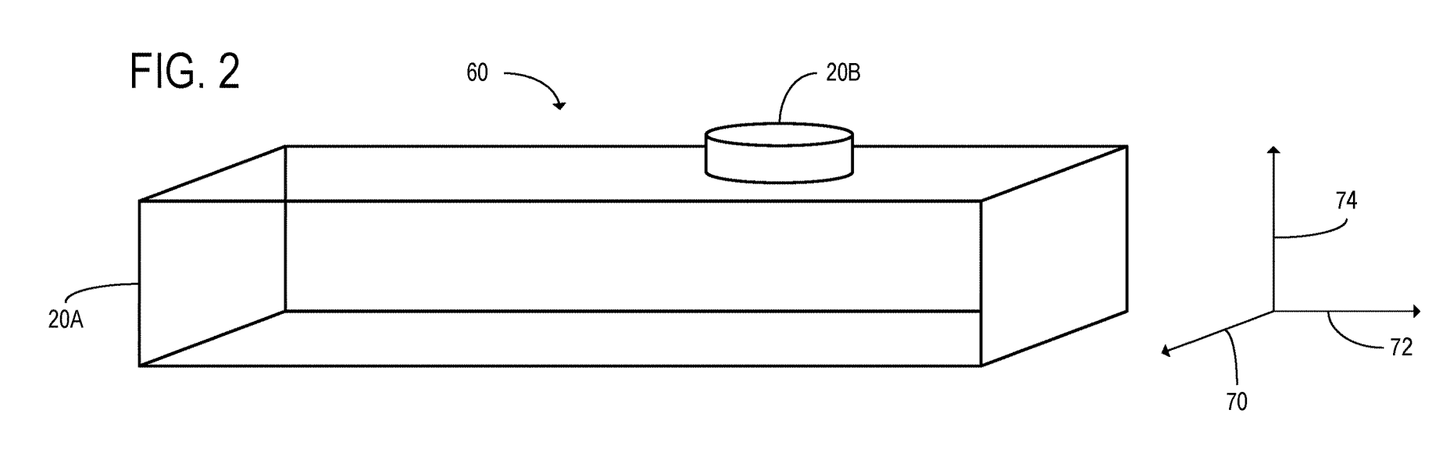
FIG. 2 shows an example three-dimensional device model including a first three-dimensional substrate element and a second three-dimensional substrate element, according to the embodiment of FIG. 1.

FIG. 2 shows an example of a three-dimensional device model 60 including a first three-dimensional substrate element 20A and a second three-dimensional substrate element 20B. FIG. 2 further shows a length dimension 70, a width dimension 72, and a height dimension 74 of the three-dimensional device model 60. The first three-dimensional substrate element 20A and the second three-dimensional substrate element 20B may have respective substrate element positions 22 within the three-dimensional device model 60. For example, the substrate element positions 22 may be specified in terms of the length dimension 70, the width dimension 72, and the height dimension 74, and may be input by a user at the GUI 66.

In addition, the three-dimensional device model 60 may include a conformal coating 48, which may include a plurality of layers. Each of the layers of the conformal coating 48 may be directly or indirectly overlaid on the one or more three-dimensional substrate elements 20. In some embodiments, the three-dimensional device model 60 may further include a respective composition indicator 68 for each of the three-dimensional substrate elements 20 and the conformal coating 48. The composition indicator for an element of the three-dimensional device model 60 may indicate the material from which that element would be formed in the modeled device. In some examples, the plurality of layers of the conformal coating 48 may have a corresponding plurality of composition indicators 68.

Generating the three-dimensional device model 60 may include, at the processor 12, receiving the one or more three-dimensional substrate elements 20. For example, the one or more three-dimensional substrate elements 20 may be defined by a user at the GUI 66 of the computer-aided engineering application program 62. The processor 12 may be further configured to receive one or more respective substrate element positions 22 of the one or more three-dimensional substrate elements 20. In embodiments in which the one or more three-dimensional substrate elements 20 have corresponding composition indicators 68, the processor 12 may be further configured to receive the one or more composition indicators 68 when receiving the one or more three-dimensional substrate elements 20.

In addition, the processor 12 may be further configured to receive one or more two-dimensional lithography elements 30. Each two-dimensional lithography element 30 may indicate a shape of at least a portion of the conformal coating 48, as discussed in further detail below. The processor 12 may be further configured to receive one or more respective lithography element positions 32 of the one or more two-dimensional lithography elements 30 that indicate the positions at which the one or more two-dimensional lithography elements 30 are located in the three-dimensional device model 60. In some embodiments, each two-dimensional lithography element 30 may have an associated composition indicator 68 that indicates a material for the corresponding portion of the conformal coating 48.

Figure 3:
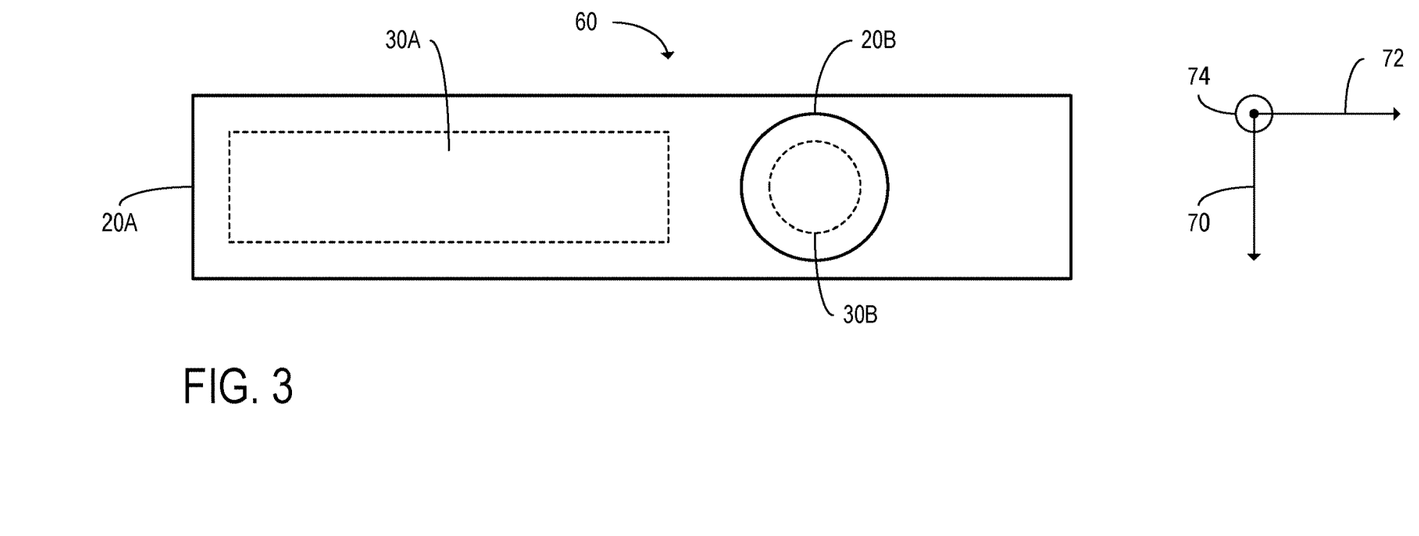
FIG. 3 shows the example three-dimensional device model of FIG. 2 with a first two-dimensional lithography element and a second two-dimensional lithography element.

FIG. 3 shows an example top view of the three-dimensional device model 60 of FIG. 2 when a first two-dimensional lithography element 30A and a second two-dimensional lithography element 30B are overlaid on the three-dimensional substrate elements 20. The first two-dimensional lithography element 30A and the second two-dimensional lithography element 30B may have respective lithography element positions 32, which may, for example, be expressed in terms of the length dimension 70, width dimension 72, and height dimension 74. The one or more lithography element positions 32 may be input by the user at the GUI 66.

Generating the three-dimensional device model 60 may further include generating the conformal coating 48 on the one or more three-dimensional substrate elements 20 over a plurality of conformal coating iterations 42. In each conformal coating iteration 40, an iteration layer 42 with an iteration layer thickness 44 and an iteration layer shape 46 may be added to the conformal coating 48. A respective iteration layer 42 may be generated for each two-dimensional lithography element 30 of the one or more two-dimensional lithography elements 30. The iteration layer 42 may be directly or indirectly overlaid on the one or more three-dimensional substrate elements 20.

In some embodiments, the respective iteration layer thicknesses 44 of the plurality of conformal coating iterations 42 may be equal to each other. Alternatively, generating the conformal coating 48 may include conformal coating iterations 40 with different respective iteration layer thicknesses 44. Generating the three-dimensional device model 60 may, in some embodiments, further include receiving a total layer thickness 24. The respective iteration layer thicknesses 44 of the plurality of iteration layers 42 may sum to the total layer thickness 24.

For each two-dimensional lithography element 30 for which an iteration layer 42 is generated, the iteration layer shape 46 of the iteration layer 42 may be the shape of at least a portion of that two-dimensional lithography element 30. In the example of FIG. 3, the first two-dimensional lithography element 30A and the second two-dimensional lithography element 30B are located on flat surfaces of the first three-dimensional substrate element 20A and the second three-dimensional substrate element 20B, respectively. In addition, the first two-dimensional lithography element 30A and the second two-dimensional lithography element 30B do not extend beyond the boundaries of the first three-dimensional substrate element 20A and the second three-dimensional substrate element 20B in the length and width directions. Thus, in the example of FIG. 3, the iteration layer shapes 46 are the shapes of the first two-dimensional lithography element 30A and the second two-dimensional lithography element 30B.

Returning to FIG. 1, generating the conformal coating 48 may further include adding the respective iteration layer 42 generated for each two-dimensional lithography element 30 to the conformal coating 48. If the current conformal coating iteration 40 is the first iteration of the plurality of conformal coating iterations 40, the one or more iteration layers 42 generated for the one or more two-dimensional lithography elements 30 may be directly overlaid onto the one or more three-dimensional substrate elements 20. If the current conformal coating iteration 40 is a later iteration, the one or more iteration layers 42 may be overlaid onto one or more previously generated iteration layers 42. Thus, the one or more iteration layers 42 may be indirectly overlaid onto the one or more three-dimensional substrate elements 20.

The generation of the one or more iteration layers 42 is now discussed in further detail. When the processor 12 generates an iteration layer 42, the processor 12 may be further configured to generate an initial bounding volume 50 for a union of the one or more three-dimensional substrate elements 20. The initial bounding volume 50 may be a volume that fully encloses the one or more three-dimensional substrate elements 20. For example, the initial bounding volume 50 may be a rectangular prism that circumscribes the union of the one or more three-dimensional substrate elements 20. In such examples, the initial bounding volume 50 may be a smallest such rectangular prism or may alternatively extend by an additional distance in one or more of the length direction 70, the width direction 72, and the height direction 74. For example, the initial bounding volume 50 may extend an additional distance in the height direction 74 past a maximum height coordinate value of the one or more three-dimensional substrate elements 20.

Figure 4:
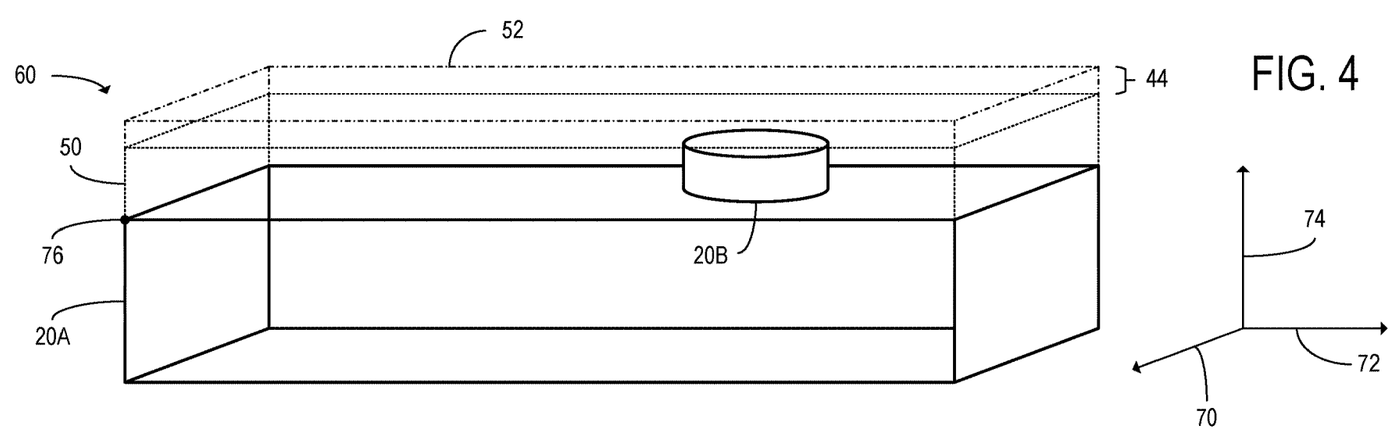
FIG. 4 shows an expanded bounding volume for the example three-dimensional device model of FIG. 2.

The processor 12 may be further configured to generate an expanded bounding volume 52, as shown in the example of FIG. 4. The expanded bounding volume 52 may be generated by expanding the initial bounding volume 50 in at least the height dimension 74 by the iteration layer thickness 44. In some embodiments, the expanded bounding volume may be generated by expanding the initial bounding volume 50 in three dimensions by the iteration layer thickness 44, rather than only expanding the initial bounding volume 50 in the height dimension 74.

Generating the expanded bounding volume 52 may, in some embodiments, include computing an offset function 64. The offset function 64 may be computed at the processor 12 or at the GPU 16. The offset function 64 may be included in the computer-aided engineering application program 62. Since the offset functions 64 included in the solid geometry kernels of computer-aided engineering application programs 62 are typically highly efficient, using an offset function 64 to generate the expanded bounding volume 52 may increase the computational efficiency of the techniques used to generate the three-dimensional device model 60. In addition, using the GPU 16 to perform the offset function 64 when generating the expanded bounding volume 52 may result in additional time savings.

Figure 5:
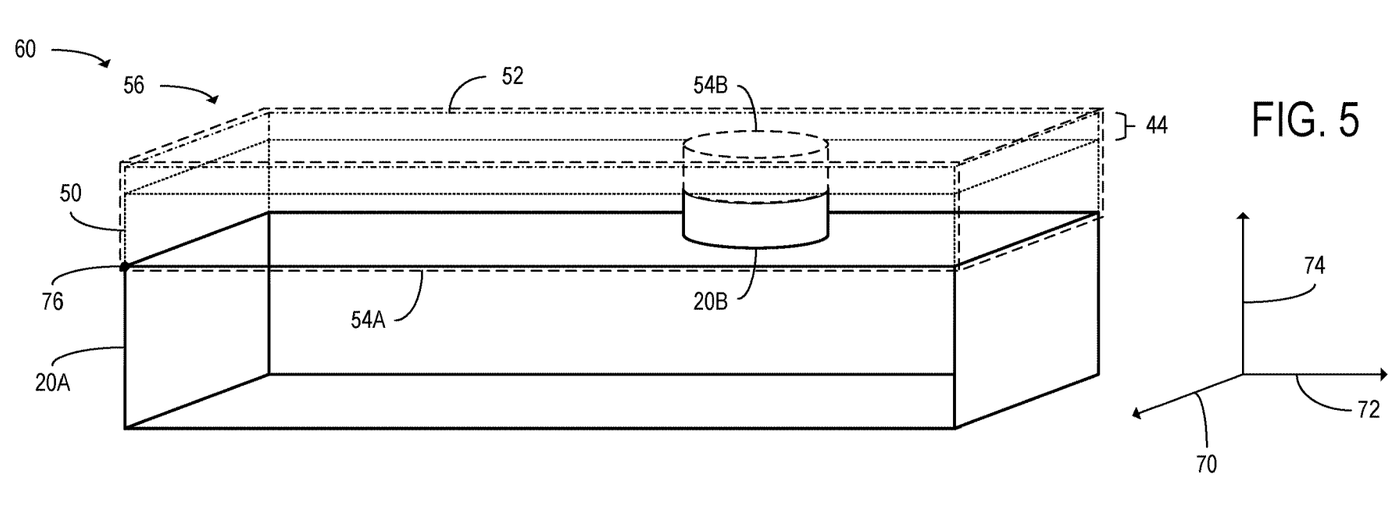
FIG. 5 shows a first-element first prism and a second-element first prism generated for the first three-dimensional substrate element and the second three-dimensional substrate element of FIG. 2.

Generating the one or more iteration layers 42 in a conformal coating iteration 40 may further include, for each three-dimensional substrate element 20, generating a respective first prism 54 that extends along the height dimension 74 from a surface of that three-dimensional substrate element 20. In some embodiments, each first prism 54 may extend along the height direction 74 to a top surface of the expanded bounding volume 52. In other embodiments, each first prism 54 may extend in the height direction 74 by some other distance. As shown in the example of FIG. 5, a first-element first prism 54A extends along the height direction 74 from the surface of the first three-dimensional substrate element 20A. In addition, a second-element first prism 54B is shown extending along the height direction 74 from the surface of the second three-dimensional substrate element 20B.

Although, in the example of FIG. 5, the top and bottom faces of each first-element first prism 54A and the second-element first prism 54B are congruent, a first prism 54 may have non-congruent top and bottom faces in other embodiments. For example, the top and bottom faces of a first prism 54 may be non-congruent when one or more three-dimensional substrate elements 20 have top faces that are angled relative to a cutting plane formed by the width dimension 70 and the height dimension 72. In such embodiments, the top face and the bottom face of the first prism 54 may be angled relative to each other.

The processor 12 may be further configured to determine an eligible lithography space 56 at least in part by determining an intersection of the expanded bounding volume 52 and the one or more first prisms 54. In the example of FIG. 5, the eligible lithography space 56 is located on the entire upper surface of the plurality of three-dimensional substrate elements 20 and has a height equal to the height of the expanded bounding volume 52.

Generating the iteration layer 42 for a two-dimensional lithography element 30 may further include generating a second prism 58 that extends along the height dimension 74 from the union of the one or more three-dimensional substrate elements 20. The second prism 58 may have a cross-sectional shape of the two-dimensional lithography element 30 along a cutting plane orthogonal to the height direction 74. In addition, the second prism 58 may extend by the iteration layer thickness 44 along the height direction 74. Similarly to the one or more first prisms 54, each second prism 58 may have top and bottom faces that are congruent with each other. Alternatively, when the top surface of at least one three-dimensional substrate element 20 is angled relative to the cutting plane, the top face and the bottom face of a second prism 58 may be non-congruent and may be angled relative to each other.

Generating the iteration layer 42 may further include selecting, as the iteration layer shape 46, a cross-section of an intersection between the second prism 58 and the eligible lithography space 56. This cross-section may be taken along the cutting plane. Thus, the iteration layer shape 46 may be the shape of the portion of the two-dimensional lithography element 30 that overlays the eligible lithography space 56.

Figure 6:
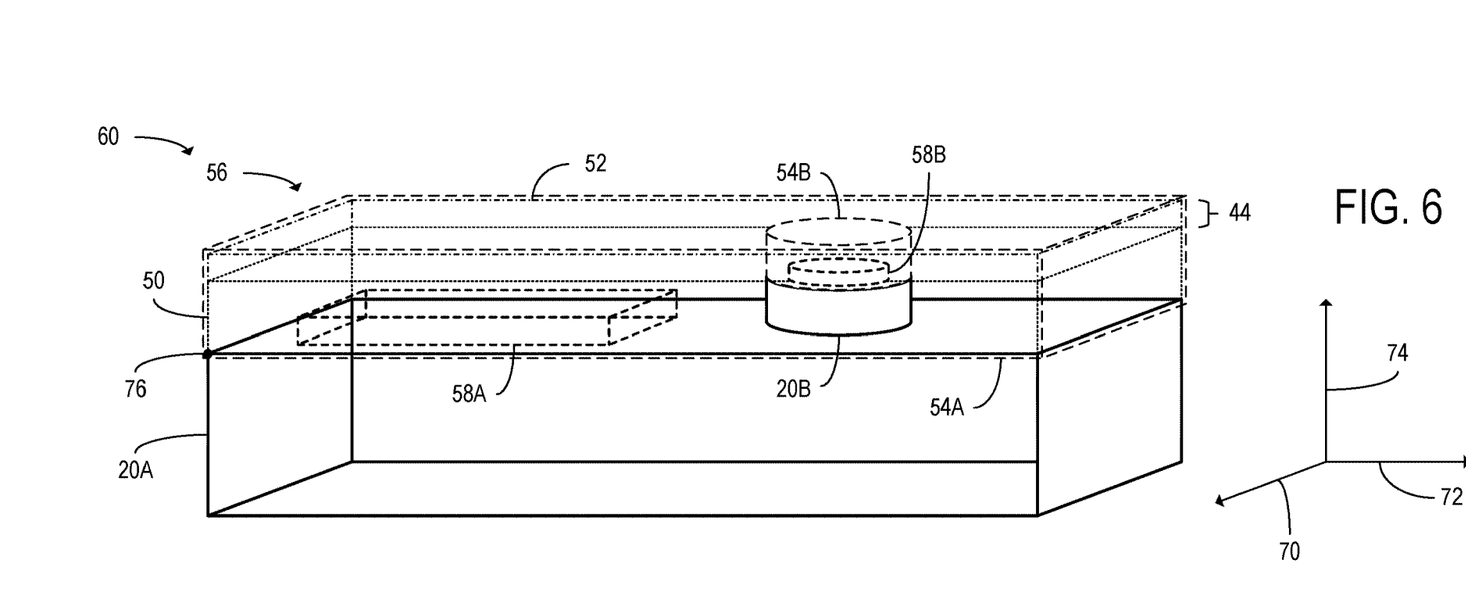
FIG. 6 shows the example three-dimensional device model of FIG. 5 when a first-element second prism and a second-element second prism have been generated based on the first two-dimensional lithography element and the second two-dimensional lithography element of FIG. 3.

FIG. 6 shows the example three-dimensional device model 60 of FIG. 5 when a first-element second prism 58A and a second-element second prism 58B extend along the height direction 74 from the union of the first three-dimensional substrate element 20A and the second three-dimensional substrate element 20B. The first-element second prism 58A and the second-element second prism 58B respectively have the cross-sectional shapes of the first two-dimensional lithography element 30A and the second two-dimensional lithography element 30B shown in FIG. 3. In addition, the first-element second prism 58A and the second-element second prism 58B extend by the iteration thickness 44 in the height direction 74.

Figure 7:
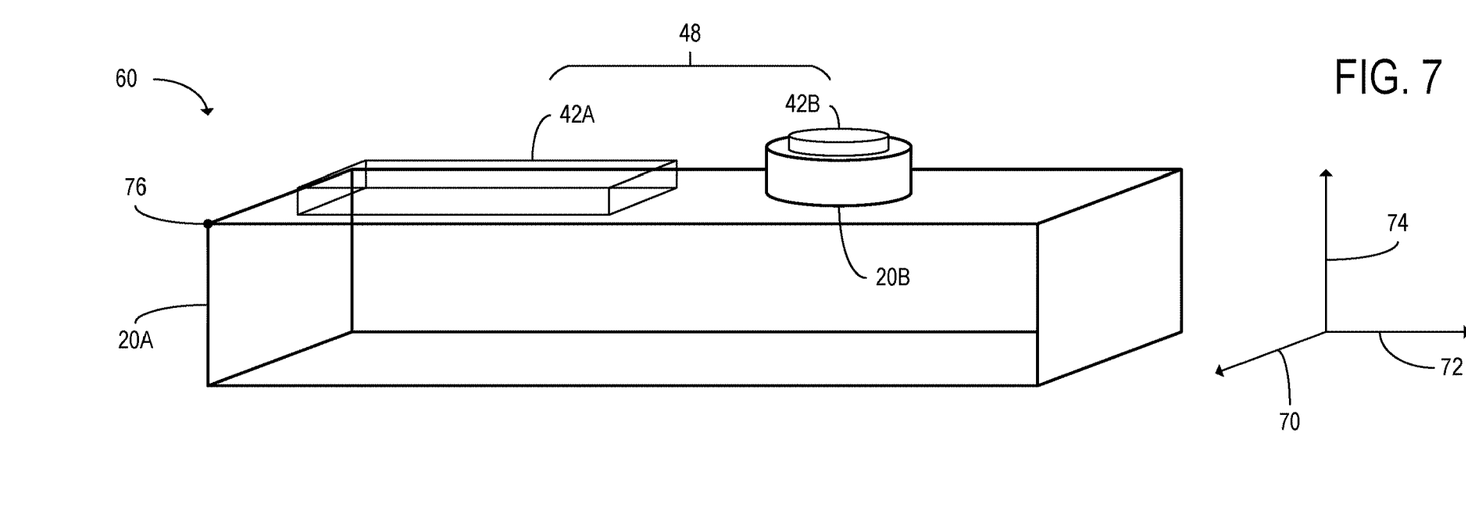
FIG. 7 shows the example three-dimensional device model of FIG. 2 with a first iteration layer and a second iteration layer generated based on the first prisms and second prisms of FIG. 6.

For each iteration layer 42, after the processor 12 has determined the iteration layer shape 46 for that iteration layer 42 as discussed above, the processor 12 may be further configured to add that iteration layer 42 to the conformal coating 48. FIG. 7 shows the example three-dimensional device model of FIG. 6 after a first iteration layer 42A and a second iteration layer 42B have been added to the conformal coating 48. In the example of FIG. 7, the first iteration layer 42A corresponds to the first-element second prism 58A and the second iteration layer 42B corresponds to the second-element second prism 58B.

Returning to FIG. 4, generating the three-dimensional device model 60 may further include receiving an initial height value 76 for the height direction 74. In the example of FIG. 4, the initial height value 76 is located at the top surface of the first three-dimensional substrate element 20A. The initial height value 76 may, for example, be specified by the user at the GUI 66. Alternatively, a default or programmatically selected initial height value 76 may be used. In embodiments in which the processor 12 receives the initial height value 76, generating the three-dimensional device model 60 may further include generating at least one of the one or more first prisms 54 or the second prism 58 to have a respective bottom-end boundary at the initial height value 76. In the example of FIG. 4, the first-element first prism 54A, the second-element first prism 54B, and the first-element second prism 58A each have respective bottom-end boundaries located at the initial height value 76.

In the example of FIG. 7, the first iteration layer 42A and the second iteration layer 42B are generated in a first conformal coating iteration 40 of a plurality of conformal coating iterations 40. In subsequent conformal coating iterations 40, the first iteration layer 42A and the second iteration layer 42B may be treated as three-dimensional substrate elements 20. The processor 12 may be configured to continue to use the first two-dimensional lithography element 30A and the second two-dimensional lithography element 30B in the subsequent conformal coating iterations 40.

Figure 8:
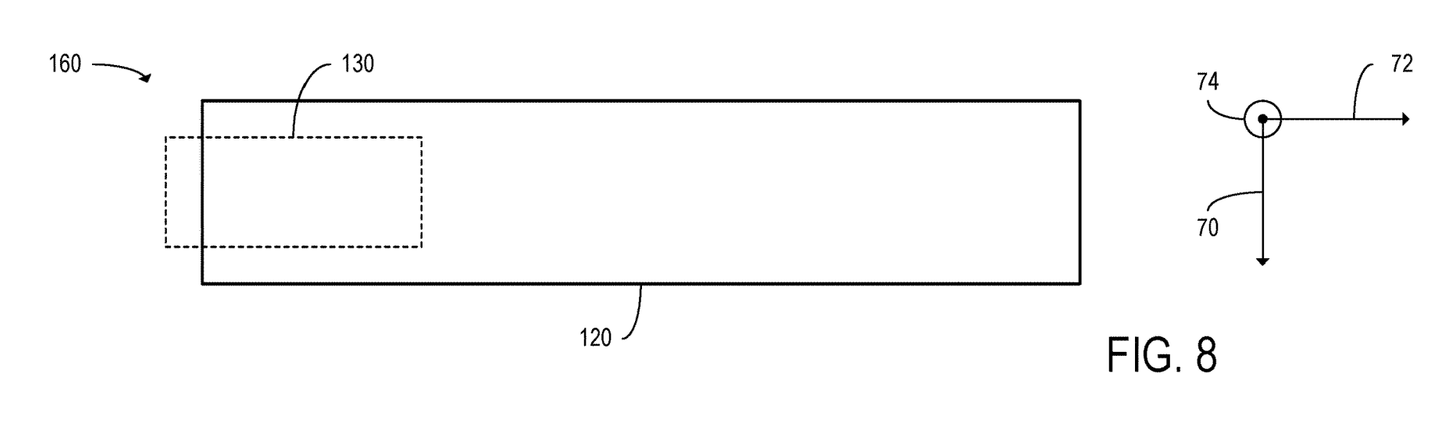
FIG. 8 shows a top view of another example three-dimensional device model including a three-dimensional substrate element and a two-dimensional lithography part, according to the embodiment of FIG. 1.
Figure 9:
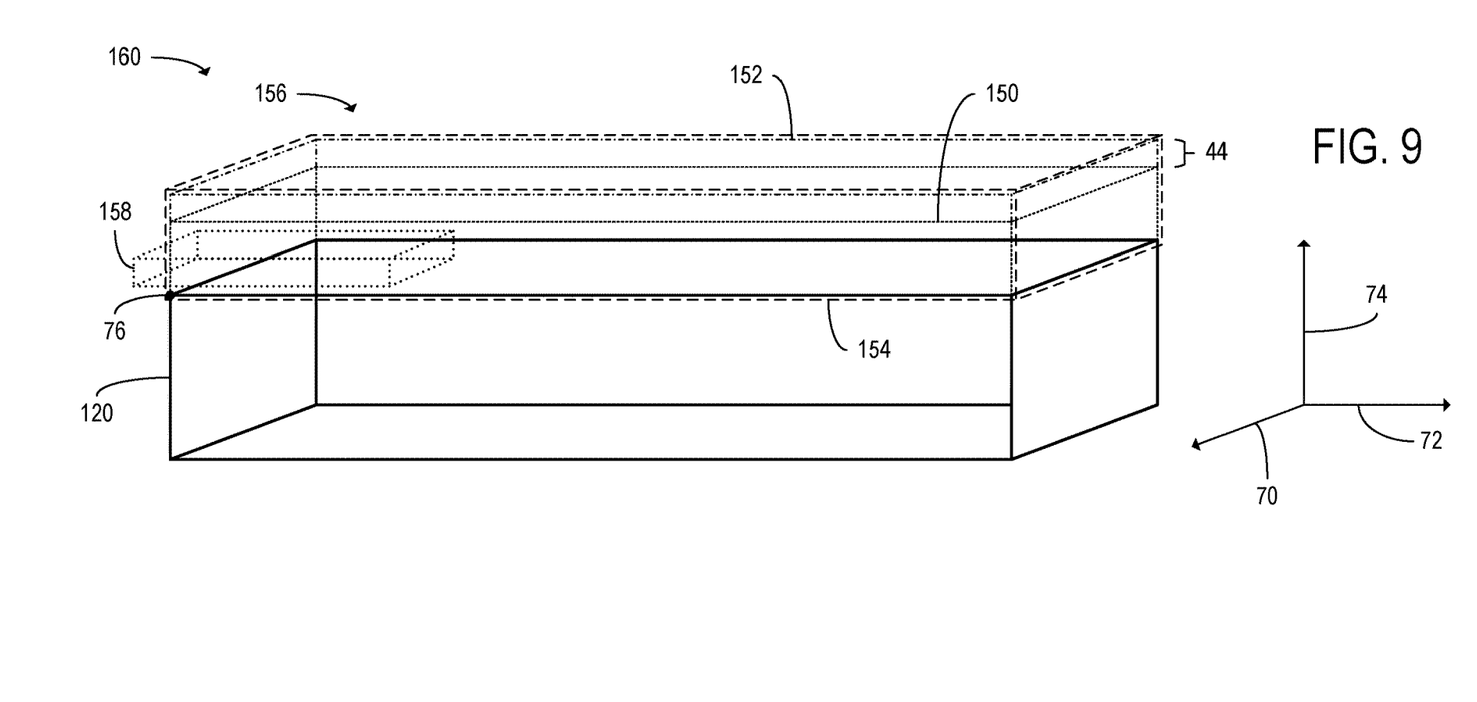
FIG. 9 shows a first prism and a second prism respectively generated for the three-dimensional substrate element and the two-dimensional lithography part of FIG. 8.
Figure 10:
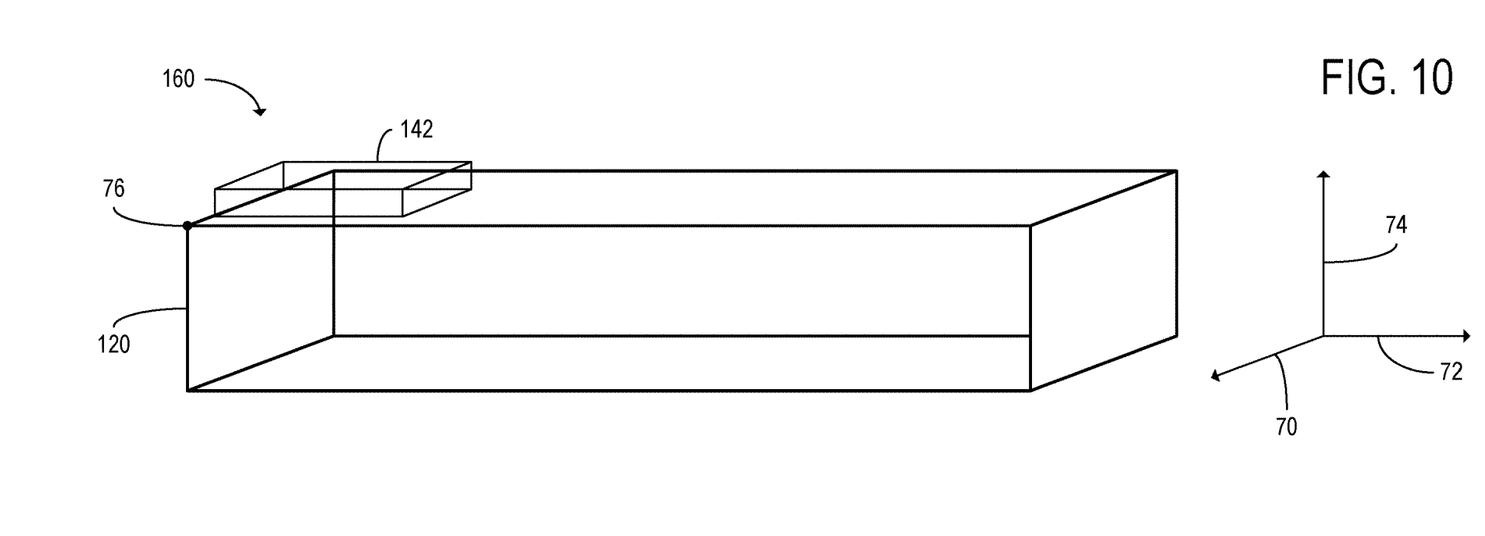
FIG. 10 shows the three-dimensional device model of FIG. 8, further including an iteration layer generated based on the first prism and the second prism of FIG. 9.

FIG. 8 shows a top view of another example three-dimensional device model 160. In the example three-dimensional device model 160, a two-dimensional lithography element 130 extends past the edge of the three-dimensional substrate element 120 above which it is located. FIG. 9 shows a first prism 154 and a second prism 158 that are generated based on the three-dimensional substrate element 120 and the two-dimensional lithography element 130, respectively. In the example of FIG. 9, an initial bounding box 150 extends in the height direction 74 from the upper surface of the three-dimensional substrate element 120. In addition, an expanded bounding box 152 extends by the iteration layer thickness 44 past the top of the initial bounding box 150. The first prism 154 fills the space between the top of the three-dimensional substrate element 120 and the top of the expanded bounding box 152, and the eligible lithography space 156 is the entire volume of the first prism 154. However, a portion of the second prism 158 is located outside the eligible lithography space. Thus, when an iteration layer 142 is generated based on the two-dimensional lithography element 130, as shown in FIG. 10, the iteration layer 142 does not extend past the edge of the three-dimensional substrate element 20A. Instead, the iteration layer 142 ends at the edge of the three-dimensional substrate element 120.

Figure 11:
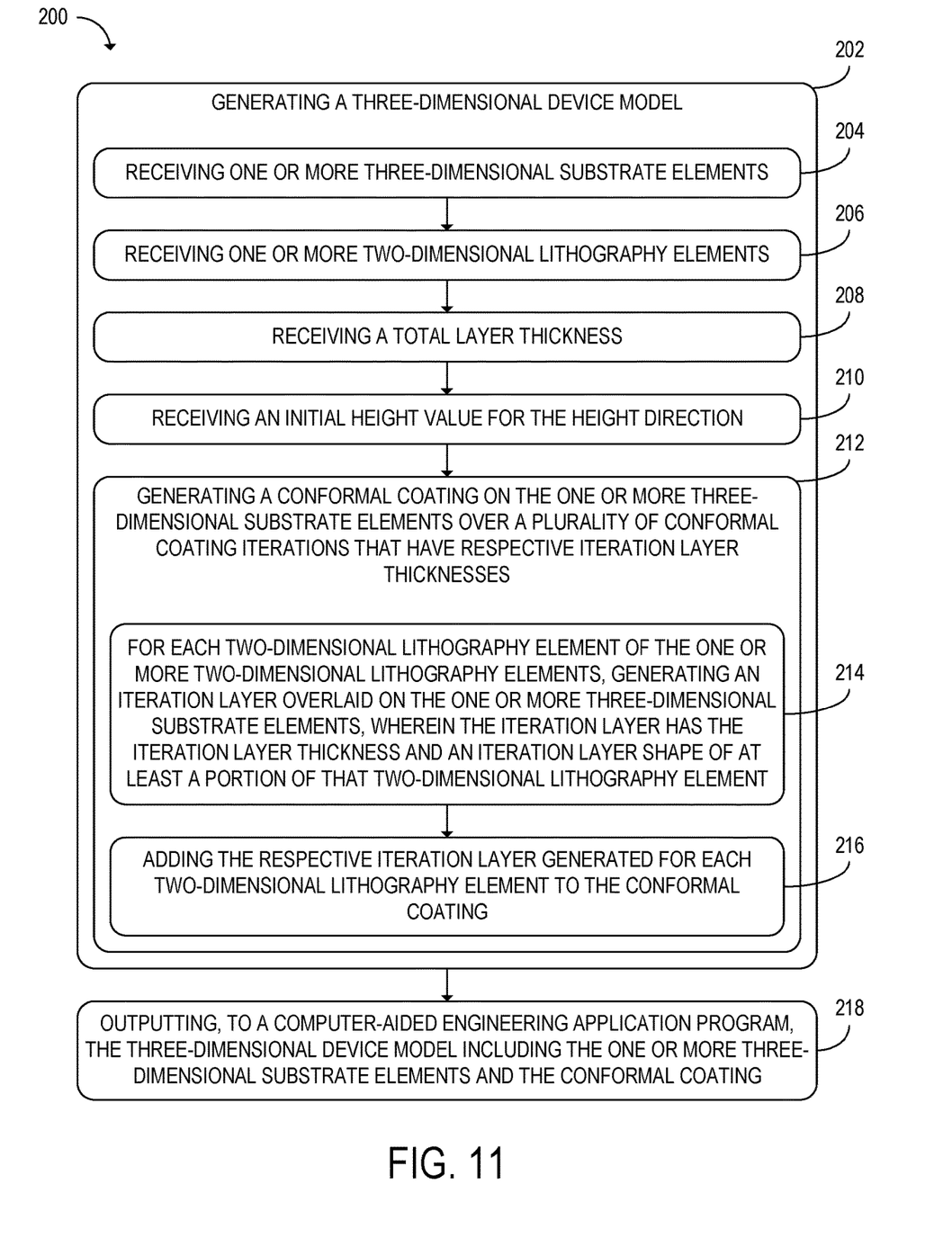
FIG. 11 shows a flowchart of an example method for generating and outputting a three-dimensional device model, according to the embodiment of FIG. 1.

FIG. 11 shows a flowchart of an example method 200 for use with a computing device. The method 200 may be used with the example computing device 10 of FIG. 1, or alternatively with some other computing device. The steps of the method 200 may each be performed at a processor. At step 202, the method 200 may include generating a three-dimensional device model. Generating the three-dimensional device model at step 202 may include, at step 204, receiving one or more three-dimensional substrate elements. Each of the one or more three-dimensional substrate elements may have a form and a substrate element position within the three-dimensional device model. In some embodiments, each three-dimensional substrate element may further have a respective composition indicator that indicates a material of that three-dimensional substrate element. Step 202 may further include, at step 206, receiving one or more two-dimensional lithography elements. The one or more two-dimensional lithography elements may each indicate a shape of at least a portion of the conformal coating. In addition, each two-dimensional lithography element may have a corresponding lithography element position within the three-dimensional device model. In some embodiments, each of the one or more two-dimensional lithography elements may further have a corresponding composition indicator.

In some embodiments, step 202 may further include, at step 208, receiving a total layer thickness for the conformal coating. When the plurality of iteration layers of the conformal coating are generated, as discussed below, the respective iteration layer thicknesses of the plurality iteration layers may sum to the total layer thickness. Additionally or alternatively, at step 210, step 202 may further include receiving an initial height value for a height direction. The initial height value may be used when determining the shape and location of the conformal coating, as discussed below.

Step 202 may further include, at step 212, generating a conformal coating on the one or more three-dimensional substrate elements. The conformal coating may be generated over a plurality of conformal coating iterations that have respective iteration layer thicknesses. Each conformal coating iteration may include, at step 214, generating an iteration layer overlaid on the one or more three-dimensional substrate elements for each two-dimensional lithography element of the one or more two-dimensional lithography elements. The iteration layer may have the iteration layer thickness and may further have an iteration layer shape of at least a portion of that two-dimensional lithography element.

Figure 12:
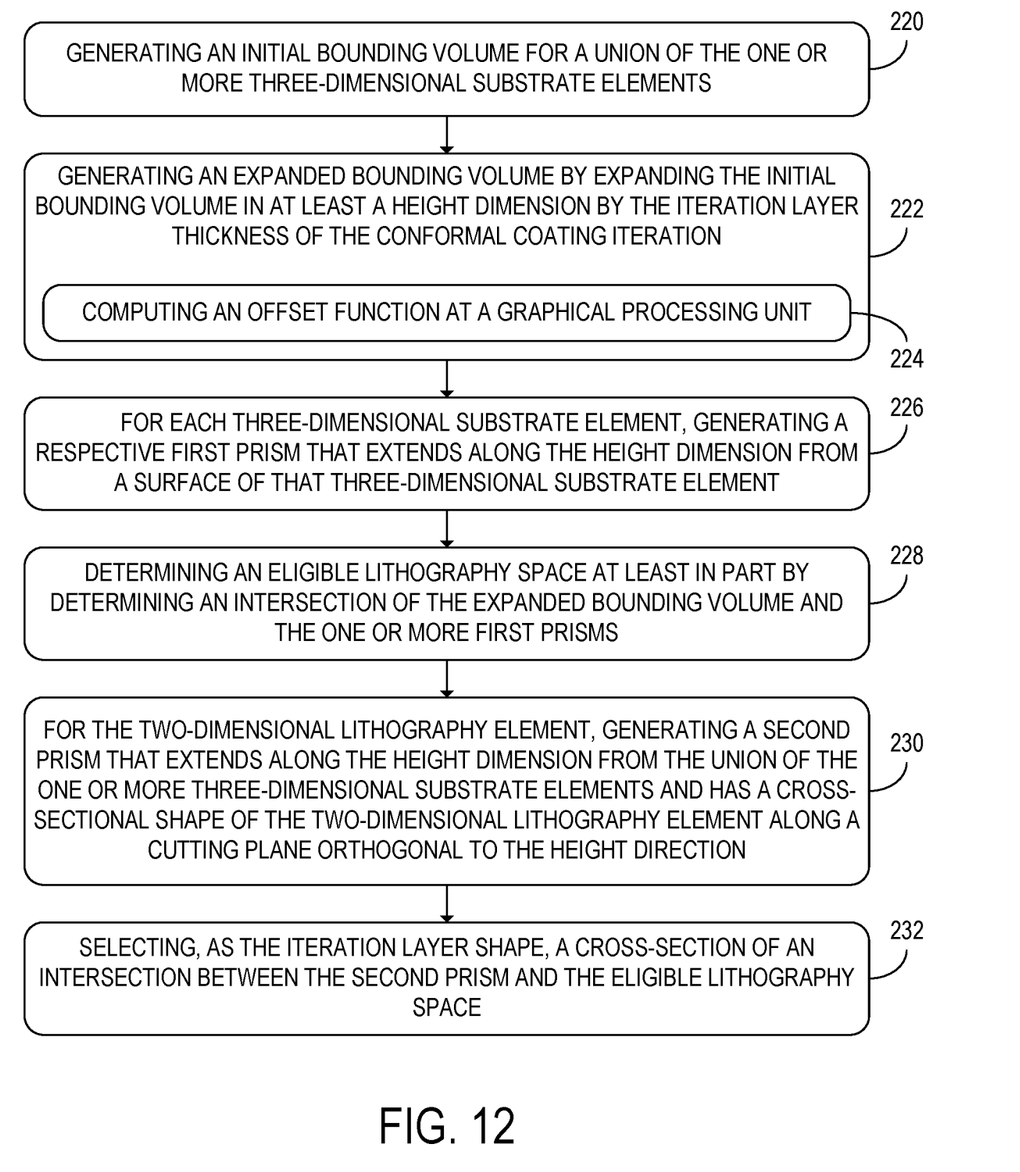
FIG. 12 shows additional steps of the method of FIG. 11 that may be performed to generate an iteration layer.

FIG. 12 shows steps of the method 200 that may be performed when generating the iteration layer at step 214. The steps of FIG. 12 may be performed for each of the one or more two-dimensional lithography elements. At step 220, step 214 may include generating an initial bounding volume for a union of the one or more three-dimensional substrate elements. In some embodiments, the initial bounding volume lies along the outer surfaces of the one or more three-dimensional substrate elements such that only space enclosed by the one or more three-dimensional substrate elements is within the initial bounding volume. In other embodiments, the initial bounding volume may further include additional space outside the union of the one or more three-dimensional substrate elements.

At step 222, step 214 may further include generating an expanded bounding volume by expanding the initial bounding volume in at least a height dimension by the iteration layer thickness of the conformal coating iteration. In some embodiments, generating the expanded bounding volume may include expanding the initial bounding volume in three dimensions by the iteration layer thickness. Step 222 may include, at step 224, computing an offset function. The offset function may be computed at the processor or at a GPU.

At step 226, step 214 may further include, for each three-dimensional substrate element, generating a respective first prism that extends along the height dimension from a surface of that three-dimensional substrate element. In some embodiments, each first prism may extend by in the height direction to the top of the expanded bounding volume. In other embodiments, each first prism may extend by some other distance greater than the iteration layer thickness. At step 228, step 214 may further include determining an eligible lithography space at least in part by determining an intersection of the expanded bounding volume and the one or more first prisms.

At step 230, step 214 may further include, for the two-dimensional lithography element, generating a second prism. The second prism may extend along the height dimension from the union of the one or more three-dimensional substrate elements and may have a cross-sectional shape of the two-dimensional lithography element along a cutting plane orthogonal to the height direction. The second prism may extend by the iteration layer thickness along the height direction. At step 232, step 214 may further include selecting, as the iteration layer shape, a cross-section of an intersection between the second prism and the eligible lithography space. The cross-section of the intersection may be taken along the cutting plane orthogonal to the height direction.

Returning to FIG. 11, generating the conformal coating at step 212 may further include, at step 216, adding the respective iteration layer generated for each two-dimensional lithography element to the conformal coating. Over the plurality of conformal coating iterations, the iteration layers generated during each conformal coating iteration may be added to the conformal coating. In each conformal coating iteration after the first iteration, the iteration layers generated in the one or more prior iterations may be treated as three-dimensional substrate elements when generating the iteration layers of the current conformal coating iteration at step 214.

At step 218, the method 200 may further include outputting, to a computer-aided engineering application program, the three-dimensional device model including the one or more three-dimensional substrate elements and the conformal coating. In some embodiments, the three-dimensional device model may be displayed on a display in a GUI of the computer aided engineering application program.

Using the systems and methods discussed above, three-dimensional device models that include conformal coatings may be generated quickly without requiring large amounts of manual drawing or simulation of chemical processes. Thus, the systems and methods discussed above may significantly reduce the computational burden of generating large numbers of three-dimensional device models with different geometries when designing qubits or other semiconductor devices.

In some embodiments, the methods and processes described herein may be tied to a computing system of one or more computing devices. In particular, such methods and processes may be implemented as a computer-application program or service, an application-programming interface (API), a library, and/or other computer-program product.

Figure 13:
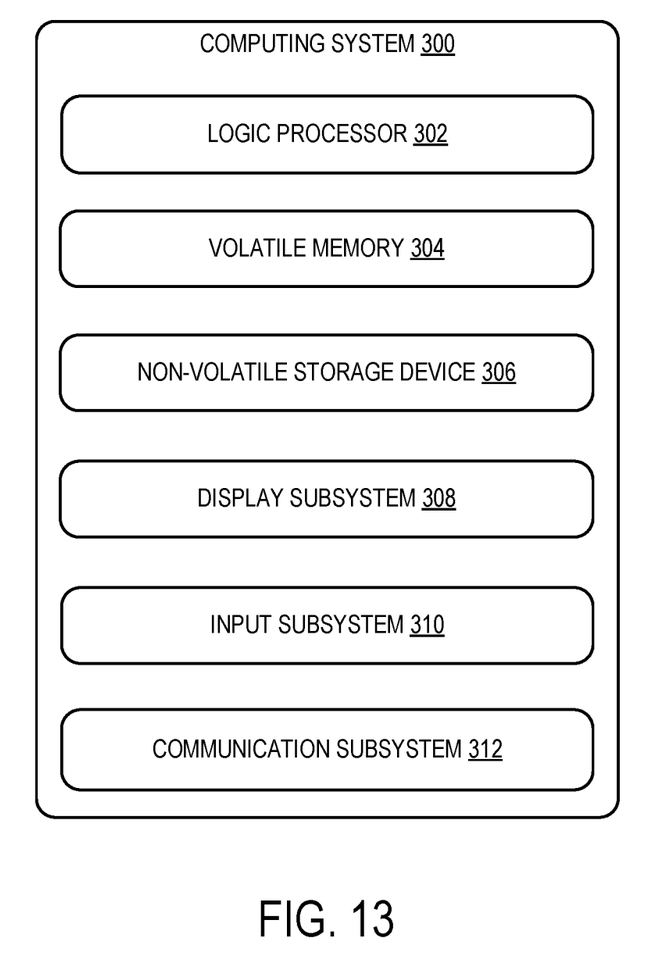
FIG. 13 shows a schematic view of an example computing environment in which the computing device of FIG. 1 may be enacted.

FIG. 13 schematically shows a non-limiting embodiment of a computing system 300 that can enact one or more of the methods and processes described above. Computing system 300 is shown in simplified form. Computing system 300 may embody the computing device 10 described above and illustrated in FIG. 1. Computing system 300 may take the form of one or more personal computers, server computers, tablet computers, home-entertainment computers, network computing devices, gaming devices, mobile computing devices, mobile communication devices (e.g., smart phone), and/or other computing devices, and wearable computing devices such as smart wristwatches and head mounted augmented reality devices.

Computing system 300 includes a logic processor 302 volatile memory 304, and a non-volatile storage device 306. Computing system 300 may optionally include a display subsystem 308, input subsystem 310, communication subsystem 312, and/or other components not shown in FIG. 13.

Logic processor 302 includes one or more physical devices configured to execute instructions. For example, the logic processor may be configured to execute instructions that are part of one or more applications, programs, routines, libraries, objects, components, data structures, or other logical constructs. Such instructions may be implemented to perform a task, implement a data type, transform the state of one or more components, achieve a technical effect, or otherwise arrive at a desired result.

The logic processor may include one or more physical processors (hardware) configured to execute software instructions. Additionally or alternatively, the logic processor may include one or more hardware logic circuits or firmware devices configured to execute hardware-implemented logic or firmware instructions. Processors of the logic processor 302 may be single-core or multi-core, and the instructions executed thereon may be configured for sequential, parallel, and/or distributed processing. Individual components of the logic processor optionally may be distributed among two or more separate devices, which may be remotely located and/or configured for coordinated processing. Aspects of the logic processor may be virtualized and executed by remotely accessible, networked computing devices configured in a cloud-computing configuration. In such a case, these virtualized aspects are run on different physical logic processors of various different machines, it will be understood.

Non-volatile storage device 306 includes one or more physical devices configured to hold instructions executable by the logic processors to implement the methods and processes described herein. When such methods and processes are implemented, the state of non-volatile storage device 306 may be transformed—e.g., to hold different data.

Non-volatile storage device 306 may include physical devices that are removable and/or built-in. Non-volatile storage device 306 may include optical memory (e.g., CD, DVD, HD-DVD, Blu-Ray Disc, etc.), semiconductor memory (e.g., ROM, EPROM, EEPROM, FLASH memory, etc.), and/or magnetic memory (e.g., hard-disk drive, floppy-disk drive, tape drive, MRAM, etc.), or other mass storage device technology. Non-volatile storage device 306 may include nonvolatile, dynamic, static, read/write, read-only, sequential-access, location-addressable, file-addressable, and/or content-addressable devices. It will be appreciated that non-volatile storage device 306 is configured to hold instructions even when power is cut to the non-volatile storage device 306.

Volatile memory 304 may include physical devices that include random access memory. Volatile memory 304 is typically utilized by logic processor 302 to temporarily store information during processing of software instructions. It will be appreciated that volatile memory 304 typically does not continue to store instructions when power is cut to the volatile memory 304.

Aspects of logic processor 302, volatile memory 304, and non-volatile storage device 306 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

The terms "module," "program," and "engine" may be used to describe an aspect of computing system 300 typically implemented in software by a processor to perform a particular function using portions of volatile memory, which function involves transformative processing that specially configures the processor to perform the function. Thus, a module, program, or engine may be instantiated via logic processor 302 executing instructions held by non-volatile storage device 306, using portions of volatile memory 304. It will be understood that different modules, programs, and/or engines may be instantiated from the same application, service, code block, object, library, routine, API, function, etc. Likewise, the same module, program, and/or engine may be instantiated by different applications, services, code blocks, objects, routines, APIs, functions, etc. The terms "module," "program," and "engine" may encompass individual or groups of executable files, data files, libraries, drivers, scripts, database records, etc.

When included, display subsystem 308 may be used to present a visual representation of data held by non-volatile storage device 306. The visual representation may take the form of a graphical user interface (GUI). As the herein described methods and processes change the data held by the non-volatile storage device, and thus transform the state of the non-volatile storage device, the state of display subsystem 308 may likewise be transformed to visually represent changes in the underlying data. Display subsystem 308 may include one or more display devices utilizing virtually any type of technology. Such display devices may be combined with logic processor 302, volatile memory 304, and/or non-volatile storage device 306 in a shared enclosure, or such display devices may be peripheral display devices.

When included, input subsystem 310 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity; and/or any other suitable sensor.

When included, communication subsystem 312 may be configured to communicatively couple various computing devices described herein with each other, and with other devices. Communication subsystem 312 may include wired and/or wireless communication devices compatible with one or more different communication protocols. As non-limiting examples, the communication subsystem may be configured for communication via a wireless telephone network, or a wired or wireless local- or wide-area network, such as a HDMI over Wi-Fi connection. In some embodiments, the communication subsystem may allow computing system 300 to send and/or receive messages to and/or from other devices via a network such as the Internet.

The following paragraphs describe several aspects of the present disclosure. According to one aspect of the present disclosure, a computing device is provided, including a processor configured to generate a three-dimensional device model. The processor may be configured to generate the three-dimensional device model at least by receiving one or more three-dimensional substrate elements and receiving one or more two-dimensional lithography elements. The processor may be further configured to generate the three-dimensional device model at least by generating a conformal coating on the one or more three-dimensional substrate elements over a plurality of conformal coating iterations that have respective iteration layer thicknesses. Each conformal coating iteration may include, for each two-dimensional lithography element of the one or more two-dimensional lithography elements, generating an iteration layer overlaid on the one or more three-dimensional substrate elements. The iteration layer may have the iteration layer thickness and an iteration layer shape of at least a portion of that two-dimensional lithography element. Each conformal coating iteration may further include adding the respective iteration layer generated for each two-dimensional lithography element to the conformal coating. The processor may be further configured to output, to a computer-aided engineering application program, the three-dimensional device model including the one or more three-dimensional substrate elements and the conformal coating.

According to this aspect, generating the iteration layer may include generating an initial bounding volume for a union of the one or more three-dimensional substrate elements. Generating the iteration layer may further include generating an expanded bounding volume by expanding the initial bounding volume in at least a height dimension by the iteration layer thickness of the conformal coating iteration.

According to this aspect, generating the expanded bounding volume may include computing an offset function at a graphical processing unit.

According to this aspect, generating the iteration layer may further include, for each three-dimensional substrate element, generating a respective first prism that extends along the height dimension from a surface of that three-dimensional substrate element. Generating the iteration layer may further include determining an eligible lithography space at least in part by determining an intersection of the expanded bounding volume and the one or more first prisms.

According to this aspect, generating the iteration layer may further include for the two-dimensional lithography element, generating a second prism that extends along the height dimension from the union of the one or more three-dimensional substrate elements and has a cross-sectional shape of the two-dimensional lithography element along a cutting plane orthogonal to the height direction. Generating the iteration layer may further include selecting, as the iteration layer shape, a cross-section of an intersection between the second prism and the eligible lithography space.

According to this aspect, the second prism may extend by the iteration layer thickness along the height direction.

According to this aspect, generating the three-dimensional device model may further include receiving an initial height value for the height direction. Generating the three-dimensional device model may further include generating at least one of the one or more first prisms or the second prism to have a respective bottom-end boundary at the initial height value.

According to this aspect, the expanded bounding volume may be generated by expanding the initial bounding volume in three dimensions by the iteration layer thickness.

According to this aspect, the respective iteration layer thicknesses of the plurality of iteration layers may be equal to each other.

According to this aspect, the three-dimensional device model may further include a respective composition indicator for each of the three-dimensional substrate elements and the conformal coating.

According to this aspect, generating the three-dimensional device model may further include receiving a total layer thickness. The respective iteration layer thicknesses of the plurality iteration layers may sum to the total layer thickness.

According to another aspect of the present disclosure, a method for use with a computing device is provided. The method may include generating a three-dimensional device model at least by receiving one or more three-dimensional substrate elements and receiving one or more two-dimensional lithography elements. The method may further include generating a conformal coating on the one or more three-dimensional substrate elements over a plurality of conformal coating iterations that have respective iteration layer thicknesses. Each conformal coating iteration may include, for each two-dimensional lithography element of the one or more two-dimensional lithography elements, generating an iteration layer overlaid on the one or more three-dimensional substrate elements. The iteration layer may have the iteration layer thickness and an iteration layer shape of at least a portion of that two-dimensional lithography element. Each conformal coating iteration may further include adding the respective iteration layer generated for each two-dimensional lithography element to the conformal coating. The method may further include outputting, to a computer-aided engineering application program, the three-dimensional device model including the one or more three-dimensional substrate elements and the conformal coating.

According to this aspect, generating the iteration layer may further include generating an initial bounding volume for a union of the one or more three-dimensional substrate elements. Generating the iteration layer may further include generating an expanded bounding volume by expanding the initial bounding volume in at least a height dimension by the iteration layer thickness of the conformal coating iteration.

According to this aspect, generating the expanded bounding volume may include computing an offset function at a graphical processing unit.

According to this aspect, generating the iteration layer may further include, for each three-dimensional substrate element, generating a respective first prism that extends along the height dimension from a surface of that three-dimensional substrate element. Generating the iteration layer may further include determining an eligible lithography space at least in part by determining an intersection of the expanded bounding volume and the one or more first prisms.

According to this aspect, generating the iteration layer may further include, for the two-dimensional lithography element, generating a second prism that extends along the height dimension from the union of the one or more three-dimensional substrate elements and has a cross-sectional shape of the two-dimensional lithography element along a cutting plane orthogonal to the height direction. Generating the iteration layer may further include selecting, as the iteration layer shape, a cross-section of an intersection between the second prism and the eligible lithography space.

According to this aspect, generating the three-dimensional device model may further include receiving an initial height value for the height direction. Generating the three-dimensional device model may further include generating at least one of the one or more first prisms or the second prism to have a respective bottom-end boundary at the initial height value.

According to this aspect, the expanded bounding volume may be generated by expanding the initial bounding volume in three dimensions by the iteration layer thickness.

According to this aspect, generating the three-dimensional device model may further include receiving a total layer thickness. The respective iteration layer thicknesses of the plurality of iteration layers may sum to the total layer thickness.

According to another aspect of the present disclosure, a computing device is provided, including a processor configured to generate a three-dimensional device model at least by receiving one or more three-dimensional substrate elements and receiving a two-dimensional lithography element. The processor may be further configured to generate the three-dimensional device model at least by generating a conformal coating on the one or more three-dimensional substrate elements over a plurality of conformal coating iterations that have respective iteration layer thicknesses. Each conformal coating iteration may include generating an initial bounding volume for a union of the one or more three-dimensional substrate elements. Each conformal coating iteration may further include generating an expanded bounding volume by expanding the initial bounding volume in at least a height dimension by the iteration layer thickness of the conformal coating iteration. Each conformal coating iteration may further include, for each three-dimensional substrate element, generating a respective first prism that extends along the height dimension from a surface of that three-dimensional substrate element. Each conformal coating iteration may further include determining an eligible lithography space at least in part by determining an intersection of the expanded bounding volume and the one or more first prisms. Each conformal coating iteration may further include, for the two-dimensional lithography element, generating a second prism that extends along the height dimension from the union of the one or more three-dimensional substrate elements and has a cross-sectional shape of the two-dimensional lithography element along a cutting plane orthogonal to the height direction. Each conformal coating iteration may further include adding, to the conformal coating, an iteration layer within an intersection between the second prism and the eligible lithography space. The processor may be further configured to output, to a computer-aided engineering application program, the three-dimensional device model including the one or more three-dimensional substrate elements and the conformal coating.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:
1. A computing device comprising:
a processor configured to:
programmatically generate a three-dimensional device model at least by:
receiving one or more three-dimensional substrate elements;
receiving one or more two-dimensional lithography elements;

generating a conformal coating model on the one or more three-dimensional substrate elements over a plurality of conformal coating iterations that have respective iteration layer thicknesses, wherein each conformal coating iteration includes:

for each two-dimensional lithography element of the one or more two-dimensional lithography elements, generating an iteration layer overlaid on the one or more three-dimensional substrate elements, wherein:

the iteration layer has the iteration layer thickness and an iteration layer shape of at least a portion of that two-dimensional lithography element; and generating the iteration layer includes:

generating an initial bounding volume for a union of the one or more three-dimensional substrate elements; and at least in part by computing an offset function at a graphical processing unit, generating an expanded bounding volume by expanding the initial bounding volume in at least a height dimension by the iteration layer thickness of the conformal coating iteration; and adding the respective iteration layer generated for each two-dimensional lithography element to the conformal coating model; and programmatically output, to a computer-aided engineering application program, the three-dimensional device model including the one or more three-dimensional substrate elements and the conformal coating model.

2. The computing device of claim 1, wherein generating the iteration layer further includes:

for each three-dimensional substrate element, generating a respective first prism that extends along the height dimension from a surface of that three-dimensional substrate element; and determining an eligible lithography space at least in part by determining an intersection of the expanded bounding volume and the one or more first prisms.

3. The computing device of claim 2, wherein generating the iteration layer further includes:

for the two-dimensional lithography element, generating a second prism that extends along the height dimension from the union of the one or more three-dimensional substrate elements and has a cross-sectional shape of the two-dimensional lithography element along a cutting plane orthogonal to the height direction; and selecting, as the iteration layer shape, a cross-section of an intersection between the second prism and the eligible lithography space.

4. The computing device of claim 3, wherein the second prism extends by the iteration layer thickness along the height direction.

5. The computing device of claim 3, wherein generating the three-dimensional device model further includes:

receiving an initial height value for the height direction; and generating at least one of the one or more first prisms or the second prism to have a respective bottom-end boundary at the initial height value.

6. The computing device of claim 1, wherein the expanded bounding volume is generated by expanding the initial bounding volume in three dimensions by the iteration layer thickness.

7. The computing device of claim 1, wherein the respective iteration layer thicknesses of the plurality of iteration layers are equal to each other.

8. The computing device of claim 1, wherein the three-dimensional device model further includes a respective composition indicator for each of the three-dimensional substrate elements and the conformal coating model.

9. The computing device of claim 1, wherein:

generating the three-dimensional device model further includes receiving a total layer thickness; and the respective iteration layer thicknesses of the plurality iteration layers sum to the total layer thickness.

10. A method for use with a computing device, the method comprising:

programmatically generating a three-dimensional device model at least by:

receiving one or more three-dimensional substrate elements;

receiving one or more two-dimensional lithography elements;

generating a conformal coating model on the one or more three-dimensional substrate elements over a plurality of conformal coating iterations that have respective iteration layer thicknesses, wherein each conformal coating iteration includes:

for each two-dimensional lithography element of the one or more two-dimensional lithography elements, generating an iteration layer overlaid on the one or more three-dimensional substrate elements, wherein:

the iteration layer has the iteration layer thickness and an iteration layer shape of at least a portion of that two-dimensional lithography element; and generating the iteration layer includes:

generating an initial bounding volume for a union of the one or more three-dimensional substrate elements; and at least in part by computing an offset function at a graphical processing unit, generating an expanded bounding volume by expanding the initial bounding volume in at least a height dimension by the iteration layer thickness of the conformal coating iteration; and adding the respective iteration layer generated for each two-dimensional lithography element to the conformal coating model; and programmatically outputting, to a computer-aided engineering application program, the three-dimensional device model including the one or more three-dimensional substrate elements and the conformal coating model.

11. The method of claim 10, wherein generating the iteration layer further includes:

for each three-dimensional substrate element, generating a respective first prism that extends along the height dimension from a surface of that three-dimensional substrate element; and determining an eligible lithography space at least in part by determining an intersection of the expanded bounding volume and the one or more first prisms.

12. The method of claim 11, wherein generating the iteration layer further includes:

for the two-dimensional lithography element, generating a second prism that extends along the height dimension from the union of the one or more three-dimensional substrate elements and has a cross-sectional shape of the two-dimensional lithography element along a cutting plane orthogonal to the height direction; and selecting, as the iteration layer shape, a cross-section of an intersection between the second prism and the eligible lithography space.

13. The method of claim 12, wherein generating the three-dimensional device model further includes:

receiving an initial height value for the height direction; and generating at least one of the one or more first prisms or the second prism to have a respective bottom-end boundary at the initial height value.

14. The method of claim 10, wherein the expanded bounding volume is generated by expanding the initial bounding volume in three dimensions by the iteration layer thickness.

15. The method of claim 10, wherein:

generating the three-dimensional device model further includes receiving a total layer thickness; and the respective iteration layer thicknesses of the plurality of iteration layers sum to the total layer thickness.

16. A computing device comprising:

a processor configured to:

programmatically generate a three-dimensional device model at least by:

receiving one or more three-dimensional substrate elements;

receiving a two-dimensional lithography element; and generating a conformal coating model on the one or more three-dimensional substrate elements over a plurality of conformal coating iterations that have respective iteration layer thicknesses, wherein each conformal coating iteration includes:

generating an initial bounding volume for a union of the one or more three-dimensional substrate elements;

at least in part by computing an offset function at a graphical processing unit, generating an expanded bounding volume by expanding the initial bounding volume in at least a height dimension by the iteration layer thickness of the conformal coating iteration;

for each three-dimensional substrate element, generating a respective first prism that extends along the height dimension from a surface of that three-dimensional substrate element;

determining an eligible lithography space at least in part by determining an intersection of the expanded bounding volume and the one or more first prisms;

for the two-dimensional lithography element, generating a second prism that extends along the height dimension from the union of the one or more three-dimensional substrate elements and has a cross-sectional shape of the two-dimensional lithography element along a cutting plane orthogonal to the height direction; and adding, to the conformal coating model, an iteration layer within an intersection between the second prism and the eligible lithography space; and programmatically output, to a computer-aided engineering application program, the three-dimensional device model including the one or more three-dimensional substrate elements and the conformal coating model.

\* \* \* \* \*